United States Patent
Purcell et al.

(10) Patent No.: US 8,054,210 B2
(45) Date of Patent: Nov. 8, 2011

(54) ANALOG TO DIGITAL CONVERTER

(75) Inventors: Matthew Purcell, Edinburgh (GB);
Rachel Elliott, Edinburgh (GB);
Graeme Storm, Forres (GB)

(73) Assignee: STMicroelectronics (Research & Development) Limited,
Marlow-Buckinghamshire (GB)

( * ) Notice: Subject to any disclaimer, the term of this patent is extended or adjusted under 35 U.S.C. 154(b) by 966 days.

(21) Appl. No.: 12/015,898

(22) Filed: Jan. 17, 2008

(65) Prior Publication Data

US 2008/0192126 A1 Aug. 14, 2008

(30) Foreign Application Priority Data

Feb. 8, 2007 (EP) .................................... 07101955

(51) Int. Cl.
*H03M 1/56* (2006.01)

(52) U.S. Cl. ........................................ 341/169; 341/155

(58) Field of Classification Search .................. 341/155, 341/169
See application file for complete search history.

(56) References Cited

U.S. PATENT DOCUMENTS

| 6,943,719 | B2 * | 9/2005 | Yun et al. | 341/155 |
| 7,227,488 | B2 * | 6/2007 | Cho | 341/155 |
| 7,250,897 | B2 * | 7/2007 | Oh | 341/169 |
| 7,345,613 | B2 * | 3/2008 | Higuchi | 341/155 |
| 2004/0046685 | A1 | 3/2004 | Yun et al. | 341/169 |
| 2005/0168251 | A1 | 8/2005 | Lim | 327/131 |

FOREIGN PATENT DOCUMENTS

| EP | 1610544 | 12/2005 |
| EP | 1635470 | 3/2006 |
| EP | 1742369 | 1/2007 |

* cited by examiner

*Primary Examiner* — Khai M Nguyen
(74) *Attorney, Agent, or Firm* — Lisa K. Jorgenson; Allen, Dyer, Doppelt, Milbrath & Gilchrist, P.A.

(57) ABSTRACT

An image sensor includes a pixel array, and a correlated double sample circuit coupled to one of the pixels in the pixel array. The correlated double sample circuit includes first and second inputs, and first and second sample capacitors respectively coupled to the first and second inputs. The first input is for receiving an analog signal from a pixel, and the second input is for receiving a time varying reference signal. The analog signal varies during a pixel readout period, and has a first level during a first reset period and a second-level during a second read period. A comparator circuit compares the time varying reference signal and the analog signal. The analog signal and the time varying reference signal are constantly read onto one of the first and second sample capacitors during both the first reset period and the second read period.

25 Claims, 2 Drawing Sheets

ANALOG TO DIGITAL CONVERTER

FIELD OF THE INVENTION

The present invention relates to analog to digital converters, and more particularly, to an analog to digital converter for an image sensor.

BACKGROUND OF THE INVENTION

CMOS image sensors have become increasingly prevalent in various devices, and in particular, mobile cellular telephones. A major demand within the mobile phone market is for small, thin, pocket sized devices that are still packed with various additional features, such as cameras incorporating CMOS image sensors. As a result, image sensor manufacturers are continually required to produce sensors with either a greater resolution for the same physical size, or a smaller physical size with at least the same resolution.

Resolution is determined in the first instance by the number of pixels within an image sensor, and secondly, by the resolutions of the analog to digital converters within the image sensor. That is, resolution is determined by the number of pixels available to represent the image being taken, and the number of bits required to represent the signal from each pixel, respectively.

U.S. Pat. No. 6,943,719 discloses an analog to digital converter (ADC) for a power saving image sensor. The ADC comprises a correlated double sampling (CDS) circuit and an output circuit. The CDS circuit includes an input for a voltage ramp, and an input for a signal from a pixel. Each input includes a switch to isolate the input signal from the CDS. The CDS circuit also includes first and second capacitors that are in series with the respective switches. An output of the CDS is connected to both the first and second capacitors, and is connected to the output circuit.

The output circuit comprises, in series, an inverter circuit having a bypass controlled by a switch, a capacitor, and an inverter also having a bypass controlled by a switch and a latch. The power consumption of the ADC is controlled by selectively enabling the inverter circuit, and selectively allowing the pixel signal onto one of the capacitors in the CDS circuit. The inverter is switched off when not required, and the pixel is switched off when not required. This helps to minimize or reduce power consumption of the circuit.

Prior art ADCs for image sensors have a number of drawbacks when attempting to increase resolution while also minimizing the size of the image sensor package. In particular, during correlated double sampling, kT/C noise or reset noise is cancelled by sampling the kT/C noise during reset before sampling the pixel signal onto the capacitors. The size of capacitors is determined by the kT/C noise. As the ADC circuit is required for every column in the pixel array, an increase in capacitor size can severely effect the size of the overall image sensor.

SUMMARY OF THE INVENTION

In view of the foregoing background, an object of the present invention is to overcome the drawbacks of prior art analog to digital converters.

This and other objects, advantages and features in accordance with the present invention are provided by an analog to digital converter for an image sensor having a pixel array and comprising a correlated double sample circuit having first and second sample capacitors, a first input for receiving an analog signal from a pixel of the pixel array, and a second input for receiving a time variant reference signal. The analog signal at the first input may vary during a pixel readout period, and have a first level during a first reset period and a second-level during a second read period. A comparator circuit may compare the time variant reference signal and the analog signal. The analog signal from the pixel and the time variant reference signal may be constantly read onto one of the two sample capacitors respectively of the correlated double sample circuit during both the first reset period and the second read period.

The comparator circuit may have at least one associated offset voltage, and may be is enabled to sample the at least one associated offset voltage onto the analog signal. The comparator circuit may comprise an inverter circuit and an output circuit coupled thereto. The inverter circuit may have a selectively connectable inverter feedback loop connection. The output circuit may comprise an output capacitor, and an output inverter.

The selective connection of the inverter feedback loop may allow an output offset of the inverter circuit to be sampled onto at least one of the two sample capacitors. The selective connection of the inverter feedback loop may also allow thermal noise from the inverter circuit to be sampled onto the output capacitor of the output circuit.

The output inverter may have a selectively connectable output feedback loop. The selective connection of the output feedback loop may allow an output offset of the output circuit to be sampled onto the output capacitor.

Another aspect of the present invention is directed to a method of converting an analog signal from an image sensor pixel during a pixel readout period to a digital signal using an analog to digital converter circuit. The analog to digital converter circuit may comprise a correlated double sample circuit having first and second sample capacitors, and a time varying reference circuit enabled to provide a time varying reference signal. The first sample capacitor may be continuously connected to the time varying reference circuit, and the second sample capacitor may be continuously connected to the pixel during the pixel readout period. The method may comprise:

(i) resetting the pixel, thereby sampling an analog signal equivalent to a pixel reset voltage onto the second capacitor;

(ii) removing the pixel from reset, wherein the analog signal is corrected for pixel reset noise on the second capacitor;

(iii) integrating light received on the pixel, wherein the analog signal is reduced according to the amount of light received;

(iv) providing the time varying reference signal;

(v) comparing the analog signal with the time varying reference signal; and (vi) outputting an output signal when the time variant reference signal corresponds to the analog signal.

If step (v) causes one ore more associated offset voltages, the method may further comprise sampling each associated offset voltage such that the analog signal is appropriately corrected. Step (v) may be implemented by a first inverting stage and a second outputting stage. The first inverting stage may have a selectively connectable inverting feedback loop connection. The second outputting stage may comprise an output capacitor, and an output inverting stage coupled thereto.

Selectively connecting the inverting feedback loop may allow an output offset of the first inverting stage to be sampled onto at least one of the two sample capacitors. Selectively connecting the inverting feedback loop may also allow thermal noise from the inverter circuit to be sampled onto the output capacitor of the output circuit. The output inverting stage may have a selectively connectable output feedback loop. Selectively connecting the output feedback loop allows an output offset of the output circuit to be sampled onto the output capacitor.

BRIEF DESCRIPTION OF THE DRAWINGS

Embodiments of the present invention will now be described, by way of example only, with reference to the accompanying drawings, in which.

DETAILED DESCRIPTION OF THE PREFERRED EMBODIMENTS

Figure 1:
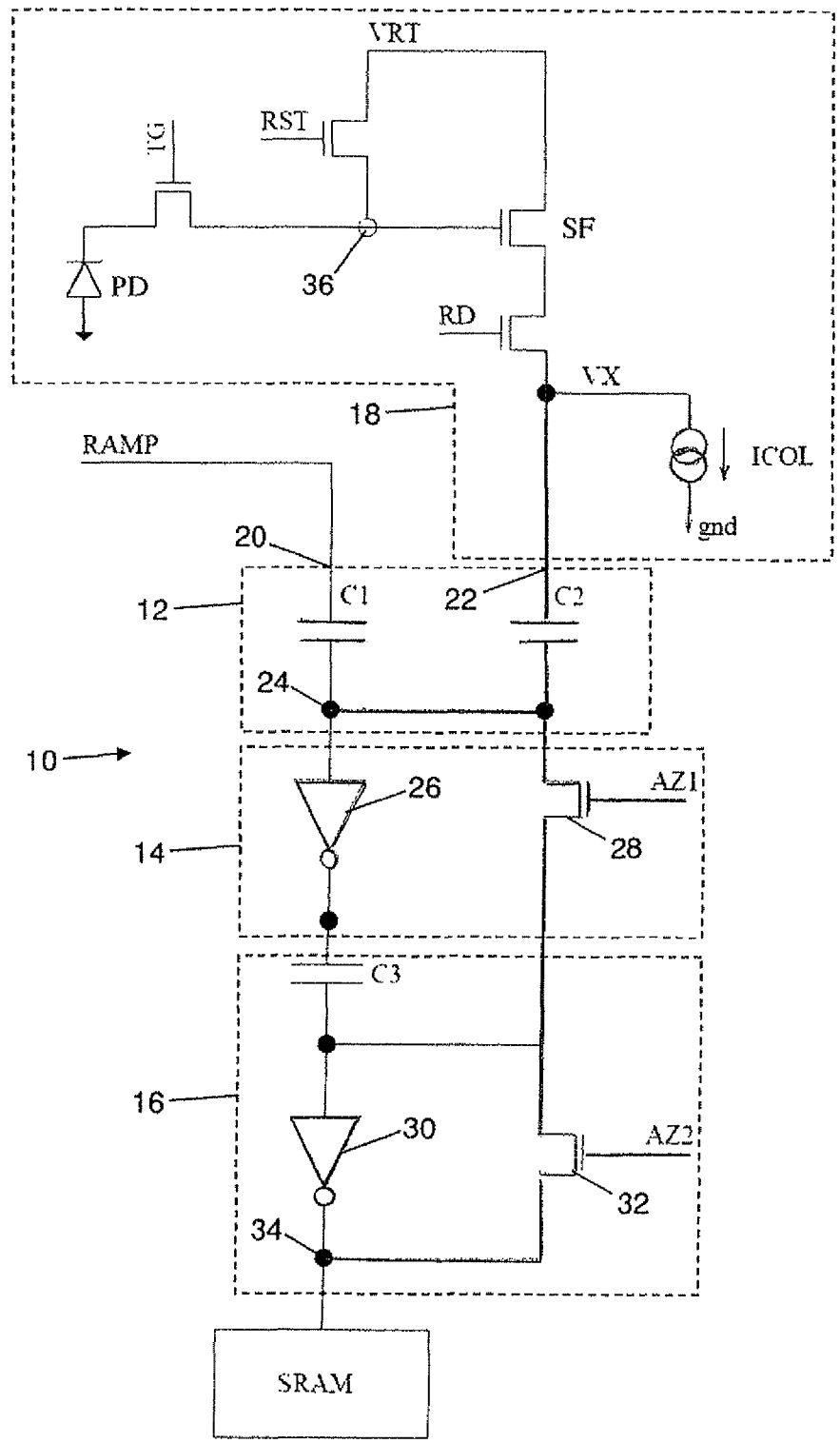
FIG. 1 illustrates an analog to digital converter and a pixel from an image sensor according to the present invention.

Referring to FIG. 1, an analog to digital converter (ADC) 10 is shown comprising a correlated double sample (CDS) circuit 12 and a comparator. The comparator comprises an inverter circuit 14 and an output circuit 16. A pixel 18 is also shown, but it should be understood that in general, the ADC 10 would be connected to a column of pixels and a controller (not shown) dictates which pixel is to be read by the ADC.

The CDS 12 comprises, in this example, a first capacitor C1 connected to a first input 20 and a second capacitor C2 connected to a second input 22. The first input 20 is connected to a ramp generator RAMP, which generates an appropriate time varying reference signal when required by the controller. The value of the time varying reference signal is known by the controller at any given time. The second input 22 is connected to the output of the pixel 18. The first and second capacitors C1, C2 are also connected to a CDS output node 24.

The inverter circuit 14, which could be a CMOS, NMOS or PMOS type inverter, comprises a first inverter 26, and in a feedback loop from the output of the first inverter 26, a first transistor 28. The first transistor 28, in this instance, operates as a switch and is activated by a signal AZ1 from the controller.

The output circuit 16 comprises a third capacitor C3 connected to the output of the inverter circuit 14, a second inverter 30, and in a feedback loop from the output of the second inverter 30 a second transistor 32. The second transistor 32, in this instance, operates as a switch and is activated by a signal AZ2 from the controller. The output circuit 16 stores the value of the pixel 18 in a memory SRAM.

The pixel 18 comprises a photodiode PD, a transfer gate transistor TG, a reset transistor RST, a source follower transistor SF and a read transistor RD. Operation of the pixel transistors are controlled by the controller.

The comparator (inverter circuit 14 and an output circuit 16) can be described as a summing comparator, in that it adds the two input values RAMP and VX. If RAMP+VX is greater than zero, the output of the comparator goes high, and if RAMP+VX is less than zero, the output of the comparator goes low. Zero for RAMP is the value of RAMP when VX(black) is measured, and zero for VX is VX(black). An explanation of VX(black) and its measurement are provided below.

The ADC 10 mitigates sample and hold noise caused by sample and hold capacitors of a correlated double sample circuit. This noise is represented by the equation:

$$\text{noise} = \sqrt{\frac{kT}{C}}.$$

This is more commonly known as kT/C noise and means that to reduce noise by two, capacitor size is required to go up by four. As such, size or noise limits are placed on the design of the image sensor. The kT/C noise of the sample capacitors C1 and C2 is mitigated by removing the requirement to hold. That is, the capacitors C1 and C2 are continuously connected to the ramp generator and VX respectively, and as such, there is a less kT/C noise generated than if a hold operation was performed.

Figure 2:
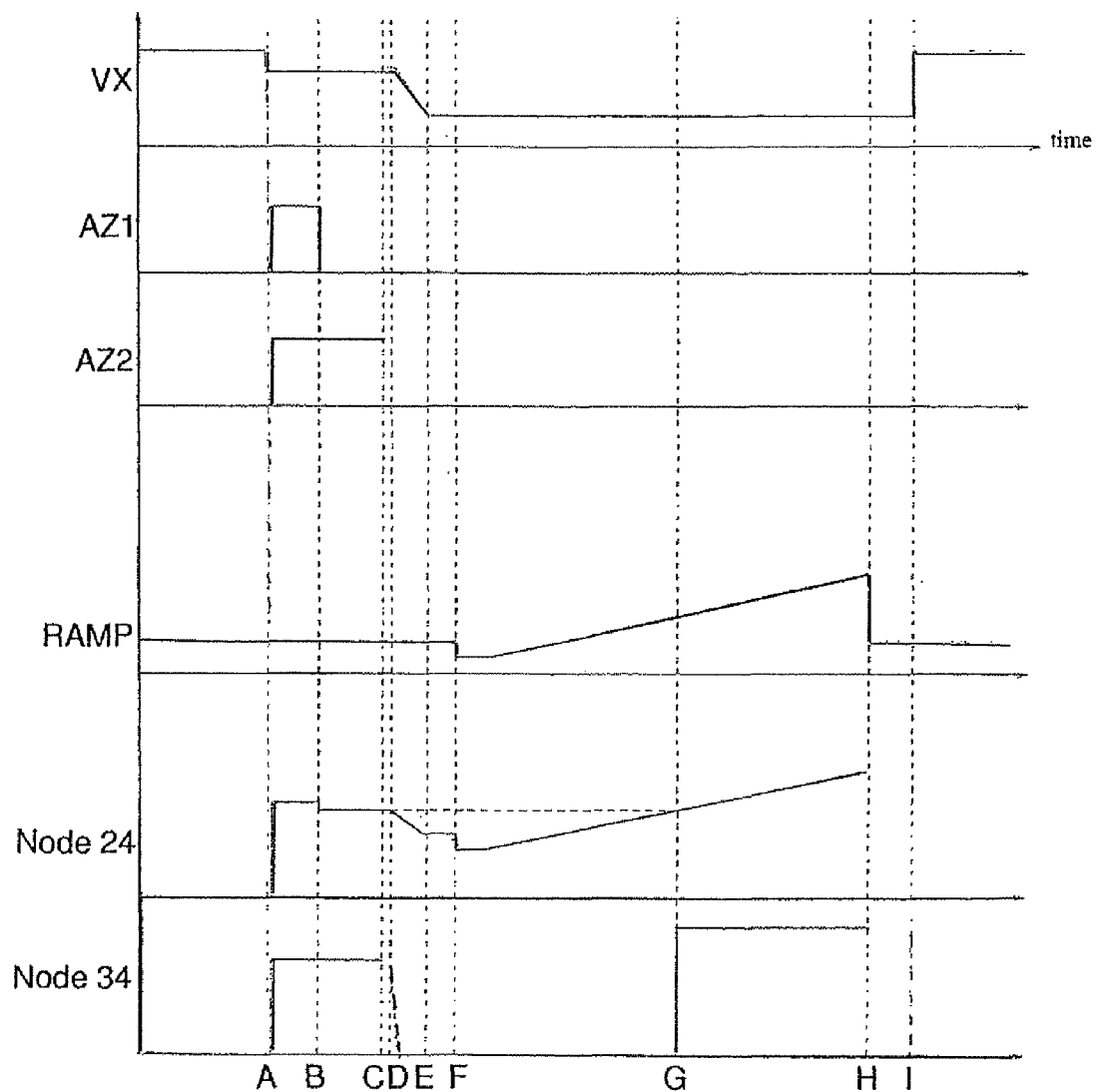
FIG. 2 illustrates a timing diagram for operation of the analog to digital converter of FIG. 1.

Referring now to FIG. 2 as well as FIG. 1, in operation during a read out cycle of a pixel, the controller first turns on read transistor RD (not shown in the timing diagram of FIG. 2) to indicate that this pixel should be read out. Reset transistor RST is then turned on in a reset phase for a period up to timing point A in FIG. 2. The reset voltage of the pixel is shown at VX in FIG. 2.

At point A, the controller then applies signal AZ1 to transistor 28 and AZ2 to transistor 32, as well as turning off reset transistor RST. In taking the pixel 18 out of reset, the output node VX drops in voltage according to the kT/C noise and charge injection of the reset transistor RST (i.e., the pixel reset noise). This gives a value for VX(black), which is the value of the pixel 18 if no light is detected taking into account pixel reset noise. As transistor 28 and transistor 32 have been turned on, the input offset of the inverter circuit 14 is sampled onto capacitors C1 and C2, and the input offset of the output circuit 16 is sampled onto capacitor C3. In addition, capacitor C2 will also have sampled VX(black) on the opposite side the input offset of the inverter circuit 14. Also at this point, the RAMP voltage is set to a value higher than zero in order to remove any nonlinearity in RAMP when it starts to ramp the voltage.

At point B the controller turns off transistor 28 by removing the signal AZ1. As a result, the kT/C noise from the inverter circuit 14 is sampled onto capacitors C1 and C2, as represented by the small drop in voltage at node 24. As AZ2 is still on, this kT/C noise is sampled onto capacitor C3 of the output circuit. That is, the input offset of the output circuit 16 is sampled on one side of capacitor C3 and the kT/C noise of the inverter circuit 14 on the other side.

At point C the controller turns off transistor 32 by removing signal AZ2. As a result, the kT/C noise from the output circuit 16 is sampled onto capacitor C3, as represented by the small drop in voltage at node 34.

At point D the transfer gate transistor TG is turned on by the controller starting a sensing phase and allowing the impinging light on the photodiode to effect the voltage at the sense node 36, and as a result, causing a decrease in voltage at VX. The transfer gate transistor TG is then turned off again by the controller at point E. The change in voltage during this period is related to the amount of light which has been received by the pixel 18. The drop in voltage at VX is reflected proportionally at node 24, and is equivalent to VX(signal), which is the value of the pixel 18 after integration.

At point F the ramp generator RAMP is started by the controller. The ramp generator voltage is reduced to begin with so that, if there is only a small change in VX, it can still be detected. The ramp generator RAMP then increases the ramp voltage over the range of detectable voltage levels. When the ramp voltage is equal to the voltage at VX, the voltage at node 34 goes high, as shown at point G in FIG. 2. The digital word representing that point is then stored in the memory SRAM by the controller, as the high at node 34 indicates that the level of RAMP corresponds to VX(black)–VX(signal) and the level of RAMP is known by the controller.

Once the ramp generator RAMP has reached the highest voltage, shown at point H, the ramp generator RAMP is reset to its nominal voltage. The controller then resets the pixel by turning the reset transistor RST on and the process can then be repeated, as required.

The ADC 10 enables relatively small sample capacitors to be used in a correlated double sample circuit, which is an important aspect of current analog to digital converters. If switches (or transistors operating as switches) are used to isolate the sample capacitors, a significant size increase is required, as the kT/C noise caused by the sample and hold operation of the switches and sample capacitors requires larger capacitor size (if noise is required to go down by 2, capacitor size must be increased by 4).

In the ADC 10, the pixel is typically on for a longer period than is required in prior art analog to digital converters. For example, in a prior art discrete analog to digital converter, the pixel will be on for approximately 5 µs, whereas with the analog to digital converter 10 the pixel 18 will be on for approximately 15 µs.

As noted above, CMOS image sensors have become increasingly prevalent in various devices, such as mobile cellular telephones. In addition, CMOS image sensors are also becoming more prevalent in optical pointing devices, endoscopes, and ambient light sensors, for example. Improvements and modifications may be incorporated without departing from the scope of the present invention.

That which is claimed:

1. An image sensor comprising:
   a pixel array;
   a correlated double sample circuit comprising
      a first input for receiving an analog signal from at least one pixel of said pixel array, the analog signal varying during a pixel readout period and having a first level during a first reset period and a second level during a second read period,
      a second input for receiving a time varying reference signal, and
      first and second sample capacitors respectively coupled to the first and second inputs; and
   a comparator circuit for comparing the time varying reference signal and the analog signal, the analog signal and the time varying reference signal being continuously read onto one of said first and second sample capacitors during both the first reset period and the second read period.

2. The image sensor according to claim 1, wherein said comparator circuit has at least one associated offset voltage, and is enabled to sample the at least one associated offset voltage onto the analog signal.

3. The image sensor according to claim 1, wherein said comparator circuit comprises an inverter circuit, and an output circuit coupled to said inverter circuit.

4. The image sensor according to claim 3, wherein said inverter circuit comprises an inverter feedback loop that is selectively connectable.

5. The image sensor according to claim 4, wherein the selective connection of said inverter feedback loop allows an output offset of said inverter circuit to be sampled onto at least one of said first and second sample capacitors.

6. The image sensor according to claim 4, wherein said output circuit comprises an output capacitor; and wherein the selective connection of said inverter feedback loop allows thermal noise from said inverter circuit to be sampled onto said output capacitor.

7. The image sensor according to claim 3, wherein said output circuit comprises an output capacitor.

8. The image sensor according to claim 7, wherein said output circuit further comprises an output inverter coupled to said output capacitor.

9. The image sensor according to claim 8, wherein said output inverter comprises an output feedback loop that is selectively connectable.

10. The image sensor according to claim 9, wherein the selective connection of said output feedback loop allows an output offset of said output circuit to be sampled onto said output capacitor.

11. A device comprising:
    a pixel array comprising a plurality of pixels arranged in rows and columns; and
    at least one analog to digital converter coupled to at least one of the columns in said pixel array, said at least one analog to digital converter comprising
       a correlated double sample circuit comprising
          a first input for receiving an analog signal from a pixel in at least one of the columns in said pixel array, the analog signal varying during a pixel readout period and having a first level during a first reset period and a second level during a second read period,
          a second input for receiving a time varying reference signal, and
          first and second sample capacitors respectively coupled to the first and second inputs; and
       a comparator circuit for comparing the time varying reference signal and the analog signal, the analog signal and the time varying reference signal being continuously read onto one of said first and second sample capacitors during both the first reset period and the second read period.

12. The device according to claim 11, wherein said comparator circuit has at least one associated offset voltage, and is enabled to sample the at least one associated offset voltage onto the analog signal; and wherein said comparator circuit comprises an inverter circuit, and an output circuit coupled to said inverter circuit.

13. The device according to claim 12, wherein said inverter circuit comprises an inverter feedback loop that is selectively connectable; and wherein said output circuit comprises an output capacitor, and an output inverter coupled to the output capacitor.

14. The device according to claim 13, wherein the selective connection of said inverter feedback loop allows an output offset of said inverter circuit to be sampled onto at least one of said first and second sample capacitors.

15. The device according to claim 12,
    wherein said output circuit comprises an output capacitor; and
    wherein the selective connection of said inverter feedback loop allows thermal noise from said inverter circuit to be sampled onto said output capacitor.

16. The device according to claim 11, further comprising a circuit coupled to said pixel array and said at least one analog to digital converter so that the device is configured as at least one of a mobile telephone, an optical pointing device, an endoscope and an ambient light sensor.

17. A method of converting an analog signal from an image sensor pixel during a pixel readout period to a digital signal using an analog to digital converter, the analog to digital converter comprising a correlated double sample circuit comprising first and second sample capacitors, a time varying reference circuit for providing a time varying reference signal, and with the first sample capacitor being continuously connected to the time varying reference circuit and the second sample capacitor being continuously connected to the image sensor pixel during the pixel readout period, the method comprising:
- (i) resetting the image sensor pixel, thereby sampling the analog signal that is equivalent to a pixel reset voltage onto the second sample capacitor;
- (ii) removing the image sensor pixel from reset, with the analog signal being corrected for pixel reset noise on the second sample capacitor;
- (iii) integrating light received on the image sensor pixel, with the analog signal being reduced according to an amount of light received;
- (iv) providing the time varying reference signal;
- (v) comparing the analog signal with the time varying reference signal; and
- (vi) providing an output signal when the time varying reference signal corresponds to the analog signal.

18. The method according to claim 17, wherein if step (v) causes at least one associated offset voltage, then the method further comprises sampling the at least one associated offset voltage so that the analog signal is appropriately corrected.

19. The method according to claim 17, wherein the analog to digital converter further comprises a comparator comprising an inverter circuit, and an output circuit coupled to the inverter circuit for performing the comparing in step (v).

20. The method according to claim 19, wherein the inverter circuit comprises an inverter feedback loop that is selectively connectable.

21. The method according to claim 20, wherein selectively connecting the inverter feedback loop allows an output offset of the inverter circuit to be sampled onto at least one of the first and second sample capacitors.

22. The method according to claim 20, wherein the output circuit comprises an output capacitor; and wherein selectively connecting the inverter feedback loop allows thermal noise from the inverter circuit to be sampled onto the output capacitor of the output circuit.

23. The method according to claim 19, wherein the output circuit comprises an output capacitor; and an output inverter coupled to the output capacitor.

24. The method according to claim 23, wherein the output inverter comprises an output feedback loop that is selectively connectable.

25. The method according to claim 24, wherein selectively connecting the output feedback loop allows an output offset of the output circuit to be sampled onto the output capacitor.

* * * * *